(12) United States Patent
Dunn et al.

(10) Patent No.: US 9,072,166 B2
(45) Date of Patent: Jun. 30, 2015

(54) FIELD SERVICEABLE ELECTRONIC DISPLAY

(71) Applicant: Manufacturing Resources International, Inc., Alpharetta, GA (US)

(72) Inventors: William Dunn, Alpharetta, GA (US); Ware Bedell, Cummings, GA (US); Don Le, Alpharetta, GA (US); David Williams, Canton, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 330 days.

(21) Appl. No.: 13/644,743

(22) Filed: Oct. 4, 2012

(65) Prior Publication Data

US 2013/0270975 A1    Oct. 17, 2013

Related U.S. Application Data

(62) Division of application No. 12/618,104, filed on Nov. 13, 2009, now Pat. No. 8,310,824.

(51) Int. Cl.
| | |
|---|---|
| *G06F 1/16* | (2006.01) |
| *H05K 5/00* | (2006.01) |
| *H04N 5/64* | (2006.01) |
| *A47B 81/06* | (2006.01) |
| *H05K 5/06* | (2006.01) |

(52) U.S. Cl.
CPC ............ *H05K 5/0017* (2013.01); *Y10T 29/4973* (2015.01); *H04N 5/64* (2013.01); *A47B 81/06* (2013.01); *H05K 5/06* (2013.01)

(58) Field of Classification Search
CPC ............ G09F 13/0413; G09F 13/0445; G09F 13/1881
See application file for complete search history.

(56) References Cited

U.S. PATENT DOCUMENTS

| | | | | | |
|---|---|---|---|---|---|
| 2,678,860 | A | * | 5/1954 | Peterson | 312/7.2 |
| 4,093,355 | A | | 6/1978 | Kaplit et al. | |
| 4,169,327 | A | * | 10/1979 | Stilling | 40/549 |
| 4,327,513 | A | * | 5/1982 | de Gunzburg | 40/572 |

(Continued)

FOREIGN PATENT DOCUMENTS

| | | |
|---|---|---|
| JP | 03153212 | 7/1991 |
| JP | 08194437 | 7/1996 |

(Continued)

OTHER PUBLICATIONS

Zeef, Hubing, EMC analysis of 18' LCD Monitor, Aug. 2000, 1 page.

*Primary Examiner* — Anthony Q Edwards
(74) *Attorney, Agent, or Firm* — Standley Law Group LLP

(57) ABSTRACT

An in-field replaceable glass assembly for an electronic display placed within a housing is disclosed. The housing preferably contains a hanger at the top of the housing, where the glass assembly contains a frame surrounding a pane of glass and having a top and bottom. A tab is preferably placed at the top of the frame and adapted to hold the glass assembly in place when slipped over the hanger on the housing. The glass assembly also contains a means for attaching the bottom of the frame to the housing. In some embodiments this means is a threaded post which extends from the frame and passing through a portion of the housing. A nut may be tightened against the post. In other embodiments a threaded fastener may pass through the housing and thread into a female threaded hole within the frame.

16 Claims, 5 Drawing Sheets

(56) References Cited

U.S. PATENT DOCUMENTS

| | | | | |
|---|---|---|---|---|
| 4,381,421 A | * | 4/1983 | Coats et al. | 174/371 |
| 4,547,987 A | * | 10/1985 | Stilling | 40/574 |
| 4,593,978 A | | 6/1986 | Mourey et al. | |
| 4,634,225 A | | 1/1987 | Haim et al. | |
| 4,759,143 A | * | 7/1988 | Pomerleau | 40/574 |
| 4,905,390 A | * | 3/1990 | Stilling | 40/549 |
| 5,029,982 A | | 7/1991 | Nash | |
| 5,088,806 A | | 2/1992 | McCartney et al. | |
| 5,247,374 A | | 9/1993 | Terada | |
| 5,363,149 A | * | 11/1994 | Furuno et al. | 348/789 |
| 5,457,905 A | * | 10/1995 | Kaplan | 40/574 |
| 5,559,614 A | | 9/1996 | Urbish et al. | |
| 5,636,101 A | * | 6/1997 | Bonsall et al. | 361/679.27 |
| 5,729,289 A | | 3/1998 | Etoh | |
| 5,748,269 A | | 5/1998 | Harris et al. | |
| 5,767,489 A | | 6/1998 | Ferrier | |
| 5,803,424 A | * | 9/1998 | Keehn et al. | 248/489 |
| 5,818,010 A | | 10/1998 | McCann | |
| 6,050,833 A | * | 4/2000 | Danzyger et al. | 439/92 |
| 6,089,751 A | | 7/2000 | Conover et al. | |
| 6,157,432 A | | 12/2000 | Helbing | |
| 6,191,839 B1 | | 2/2001 | Briley | |
| 6,198,515 B1 | * | 3/2001 | Cole | 348/836 |
| 6,231,446 B1 | * | 5/2001 | Majima et al. | 463/46 |
| 6,417,900 B1 | | 7/2002 | Shin et al. | |
| 6,469,752 B1 | * | 10/2002 | Ishikawa et al. | 348/834 |
| 6,535,266 B1 | | 3/2003 | Nemeth et al. | |
| 6,557,284 B2 | * | 5/2003 | Nolan | 40/574 |
| 6,628,355 B1 | | 9/2003 | Takahara | |
| 6,839,104 B2 | | 1/2005 | Taniguchi et al. | |
| 6,885,412 B2 | | 4/2005 | Ohnishi et al. | |
| 6,943,768 B2 | | 9/2005 | Cavanaugh et al. | |
| 6,976,330 B2 | * | 12/2005 | Milliken | 40/574 |
| 7,226,176 B1 | * | 6/2007 | Huang | 359/609 |
| 7,292,435 B2 | * | 11/2007 | She | 361/679.27 |
| 7,334,361 B2 | * | 2/2008 | Schrimpf et al. | 40/452 |
| D612,818 S | * | 3/2010 | Lents, Jr. | D14/125 |
| 8,418,387 B2 | * | 4/2013 | Swatt et al. | 40/606.18 |
| 2001/0043290 A1 | * | 11/2001 | Yamamoto | 348/836 |
| 2002/0101553 A1 | | 8/2002 | Enomoto et al. | |
| 2002/0126248 A1 | * | 9/2002 | Yoshida | 349/149 |
| 2003/0007109 A1 | | 1/2003 | Park | |
| 2004/0036834 A1 | | 2/2004 | Ohnishi et al. | |
| 2004/0165139 A1 | | 8/2004 | Anderson et al. | |
| 2005/0105178 A1 | * | 5/2005 | Kim | 359/460 |
| 2007/0267554 A1 | | 11/2007 | Tannas | |
| 2008/0276507 A1 | * | 11/2008 | Hines | 40/541 |
| 2009/0141199 A1 | * | 6/2009 | Fujikawa | 348/836 |
| 2009/0241388 A1 | * | 10/2009 | Dunn | 40/463 |
| 2010/0171889 A1 | * | 7/2010 | Pantel et al. | 349/1 |

FOREIGN PATENT DOCUMENTS

| | | |
|---|---|---|
| JP | 11160727 | 6/1999 |
| JP | 2002158475 | 5/2002 |
| JP | 2005134849 | 5/2005 |
| JP | 2008046435 | 2/2008 |
| KR | 1020070070675 | 7/2007 |

* cited by examiner

FIELD SERVICEABLE ELECTRONIC DISPLAY

CROSS-REFERENCE TO RELATED APPLICATIONS

This application is a divisional application of U.S. application Ser. No. 12/618,104, filed on Nov. 13, 2009, which is now issued U.S. Pat. No. 8,310,824, herein incorporated by reference in its entirety.

BACKGROUND OF THE INVENTIVE FIELD

The exemplary embodiments herein are directed towards an electronic display which can be serviced or repaired while remaining in a mounted position.

SUMMARY OF THE GENERAL INVENTIVE CONCEPT

Electronic displays are now being used for not only indoor entertainment purposes, but are now being utilized for indoor and outdoor advertising/informational purposes. For example, liquid crystal displays (LCDs), plasma displays, light emitting diode (LED), electroluminescence, light-emitting polymers, organic light emitting diode displays (OLEDs) and many other flat panel displays can now be used to display information and advertising materials to consumers in locations outside of their own home or within airports, arenas, transit stations, stadiums, restaurants/bars, gas station pumps, billboards, and even moving displays on the tops of automobiles or on the sides of trucks.

The rapid development of flat panel displays has allowed users to mount these displays in a variety of locations that were not previously available. Further, the popularity of high definition (HD) television has increased the demand for larger and brighter displays, especially large displays which are capable of producing HD video. The highly competitive field of consumer advertising has also increased the demand for large, attention-grabbing, bright displays. Displays which can provide these features typically contain a number of advanced electronic assemblies, which over time, can fail or degrade in performance. Once these displays are mounted in the user's desired position, replacing any failed electronic assemblies can be a costly and time-consuming process. Typically, the display must be removed from its mounted position so that it can be serviced. Removing the display can be very expensive and time consuming, especially in highly trafficked and difficult-to-access areas. Further, replacement of certain parts may require a 'clean room' environment.

Typically, the replacement of many electronic assemblies requires access to the rear of the display, which is often used as the mounting surface for the display (thus limiting access to the rear of the display). In many applications, electronic displays may be mounted side-by-side in an array, where access to the right or left (or both) sides of the display is also limited. Further, in some applications a display may be mounted near overhead obstacles such as lights, ceilings, and overhangs where access to the top of the display is also limited. Further, in some applications a pair of displays may be mounted back-to-back so that access to the rear of the display is limited due to the presence of the other display.

Exemplary embodiments include electronic displays which provide access to the rear of the display through the bottom of the display housing. Embodiments may fasten the components of the image assembly to a front housing which may rotate to allow access to the components of the display. Thus, embodiments which use this arrangement may be mounted directly below, and/or directly to the right or left of obstacles and still allow access to various components for servicing or replacement.

Further, some embodiments may contain a front glass assembly that can be replaced if it becomes damaged. The front glass assembly may be attached to the housing a minimal number of fastening means so that the front glass assembly can be quickly changed by minimally-trained personnel. A gutter may surround the interface between the front glass assembly and the housing to ensure that contaminates cannot enter the housing. The gutter may be sealed with a sealing material, for example a gasket.

An exemplary display can be serviced quickly, by minimally-trained personnel while the display remains in its mounted position. The end user may even service the display themselves. Especially in advertising, when displays are inoperable or malfunctioning, valuable advertising revenue can be lost. By reducing the amount of time required to access a display, any interruption of traffic (both human, auto, and rail) may be minimized.

The exemplary embodiments herein are not intended to be exhaustive or to unnecessarily limit the scope of the embodiments. The exemplary embodiments were chosen and described in order to explain the principles so that others skilled in the art may practice the embodiments. Having shown and described exemplary embodiments, those skilled in the art will realize that many variations and modifications may be made to affect the described invention. Many of those variations and modifications will provide the same result and fall within the spirit of the exemplary embodiments. It is the intention, therefore, to limit the embodiments only as indicated by the scope of the claims.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Figure 1:
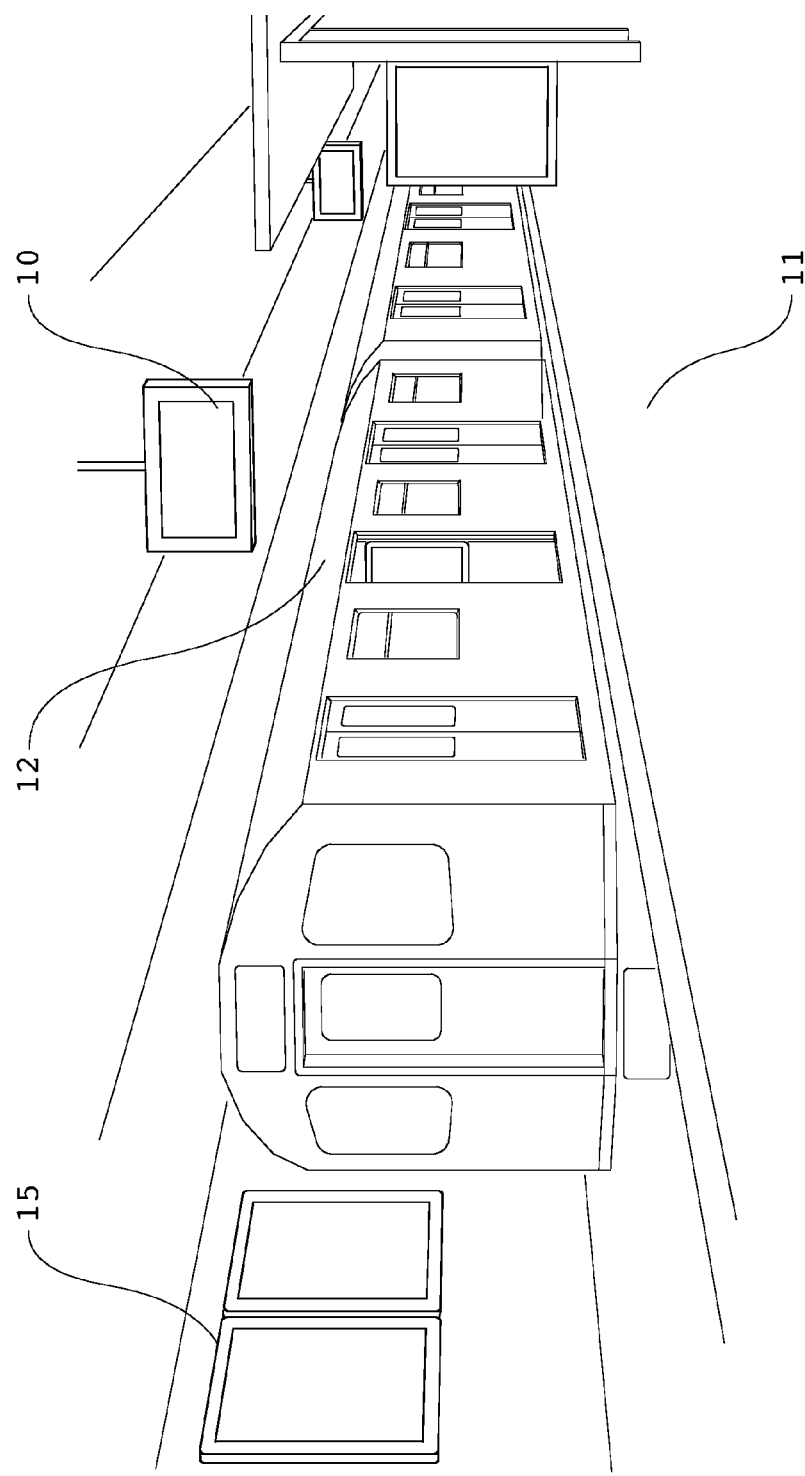
FIG. 1 provides an illustration of various mounting positions for electronic displays.

FIG. 1 provides an illustration of several possible placement positions for modern electronic displays. The particular illustration shown in this figure is a transit station (ex. light rails, subways, passenger trains). Display 10 is mounted above the platform 11 and adjacent to the train 12. As can be readily appreciated, display 10 is located in a highly-trafficked area so that its visibility to consumers remains high. However, to remove the display 10 from its mounted position in order to service the display 10 would result in a lengthy disruption of the human traffic below. This disruption would be repeated when the display 10 is again remounted (or replaced). Some displays can be very heavy (150-400 lbs for example) and can be very difficult to remove from their mounting and/or re-mount. Further, the lengthy downtime while the display 10 is being repaired/replaced would result in a loss of valuable advertising revenue. Alternatively, if the display 10 is being used for informational purposes (i.e. departure/arrival times, weather/travel advisories, etc.) a lengthy downtime will delay the transmission of this valuable information to users.

An array of displays 15 is also shown in FIG. 1. The displays 15 are placed adjacent to one another and in close proximity to the train 12. Obviously, there is a small window of opportunity to access displays 15 because access is only possible between train stops.

Figure 2:
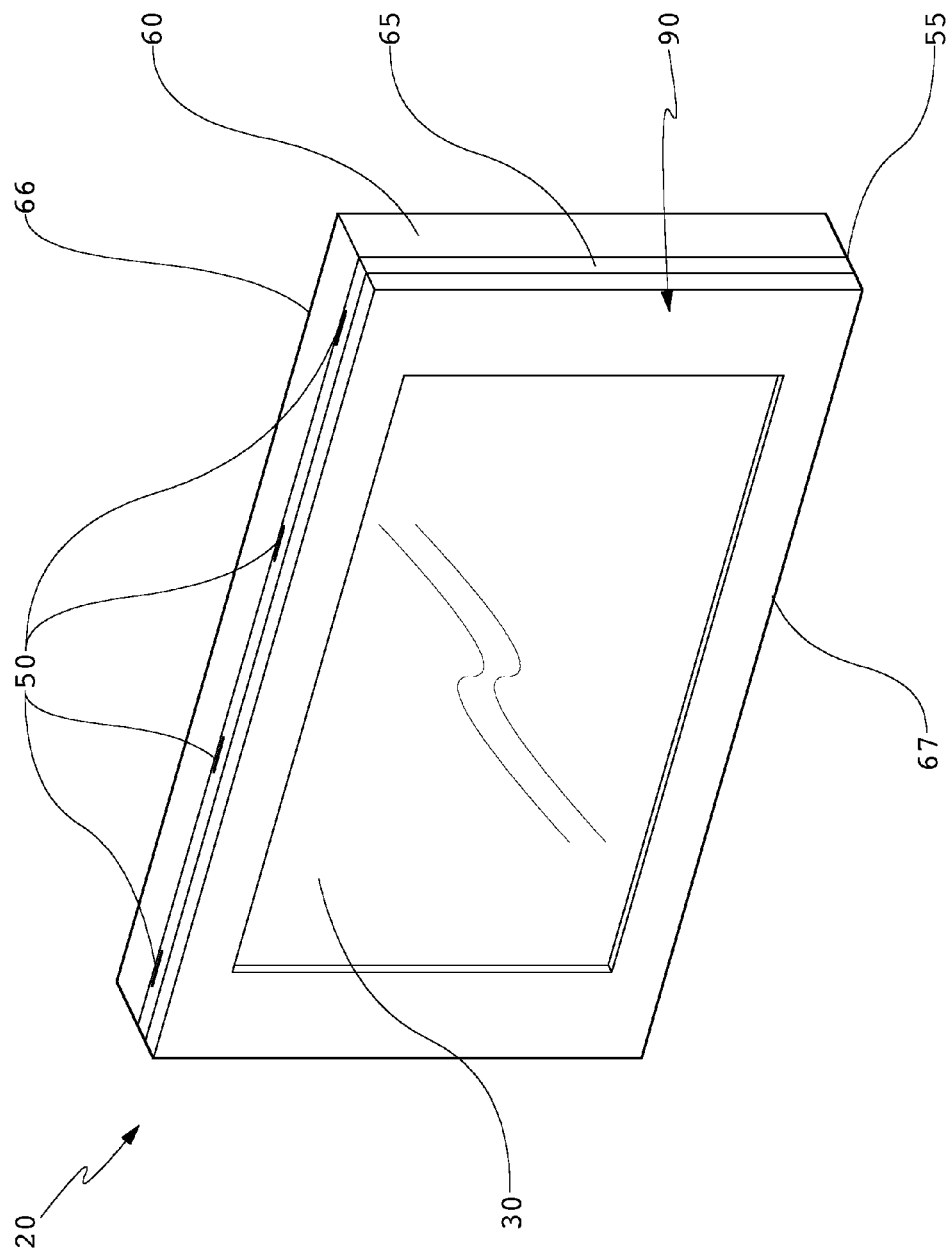
FIG. 2 provides a perspective view of an exemplary display when the front housing is closed.

FIG. 2 provides an exemplary display 20 which is oriented in a landscape manner. It should be noted that the embodiments taught herein may be used with displays in both landscape orientation (similar to display 10 in FIG. 1) and portrait orientation (similar to displays 15 in FIG. 1). The image assembly 30 (sometimes known as the 'display stack') is contained within a housing 55, which is divided into a front housing 65 and rear housing 60. The front and rear housings 65 and 60 may be attached along the top edge 66 and bottom edge 67 of the housing 55. Along the top edge 66, one or more hinging mechanisms 50 may be used to hingedly attach the front housing 65 to the rear housing 60. Along the bottom edge 67, one or more locking or latching mechanisms 80 (shown in FIG. 3) may be used to removably attach the bottom edge of the front housing 65 to the bottom edge of the rear housing 60. An exemplary locking or latching mechanism would prevent unauthorized users from opening the display. Thus, it would preferably require a unique access instrument such as a key, RFID, or a special mechanical tool in order to release.

Figure 3:
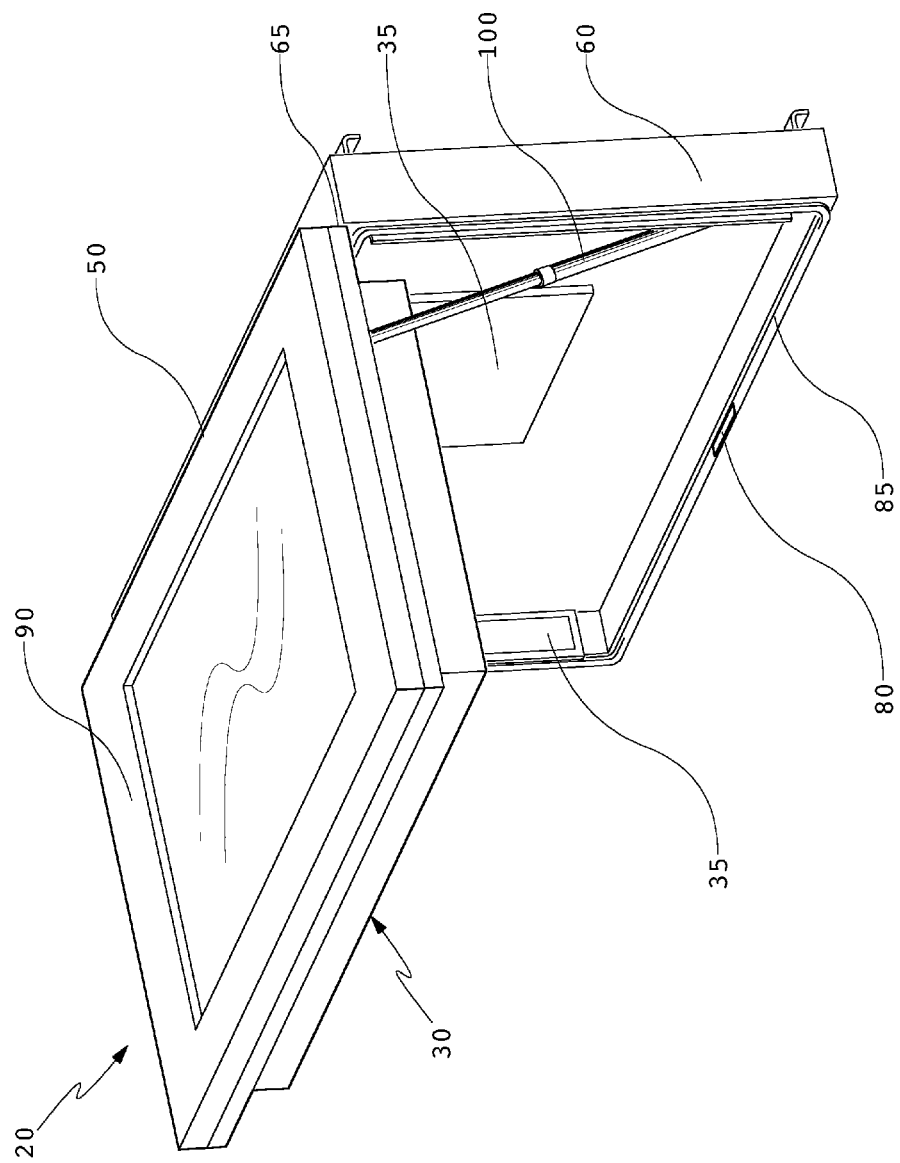
FIG. 3 provides a perspective view of an exemplary display when the front housing is opened.

FIG. 3 shows an exemplary display 20 where the front housing 65 has been unlatched from latching mechanism 80 and hinged about the hinging mechanism 50 into the 'open position'. An optional axial force mechanism 100 provides an upward force to both rotate the front housing 65 about the hinging mechanism 50 as well as hold the front housing 65 in the open position. An axial force mechanism 100 may or may not be necessary depending on the size of the display. An exemplary axial force mechanism might be a compression spring or more preferably a gas spring. A locking collar or other locking device may be used to ensure that the axial force mechanism 100 does not release and allow the front housing 65 to close. Alternatively, a support member may be used which does not axially extend, but may be placed once the front housing is in an 'open' position (similar to a common support member used to hold the hood of an automobile open).

A sealing material 85 may be placed between the surfaces and edges where the front and rear housings 65 and 60 meet. A gasket may be used as an exemplary sealing material. An overlap between the edges may be used to help prevent contaminates from entering the housing 55. This overlap is sometimes referred to as a 'gutter' and is discussed further in FIG. 4.

As can be observed from FIG. 3, once the front housing 65 is in the open position, the rear portion of the image assembly 30 can be accessed, as well as a plurality of other electronic assemblies 35 which may be stored in the rear housing 60. The various electronic assemblies 35 may include, but are not limited to: power supplies, video cards, wireless network devices, Ethernet ports, cooling devices, LAN devices, timing and control devices (TCON), fans, backlights, and various portions of the image assembly 30 (or the entire image assembly 30). The image assembly 30 will vary depending on the type of display being used. For example, if an LCD display is being used the image assembly will typically comprise several layers including: a backlight, front and rear polarizers, liquid crystal material sandwiched between two transparent plates, an electrically-conductive layer, and possibly additional polarizing/anti-reflective layers. An OLED display on the other hand, may comprise: a cathode, emissive layer, conductive layer, and an anode. As mentioned above, embodiments can be practiced with any type of flat panel display, including but not limited to: LCD, OLED, plasma, light emitting polymer (LEP) and organic electro luminescence (OEL) displays.

In addition to facilitating access to the various electronic assemblies 35 and the image assembly 30, an exemplary embodiment also contains a removable exterior front glass assembly 90 which is removably attached to the front housing 65.

Figure 4:
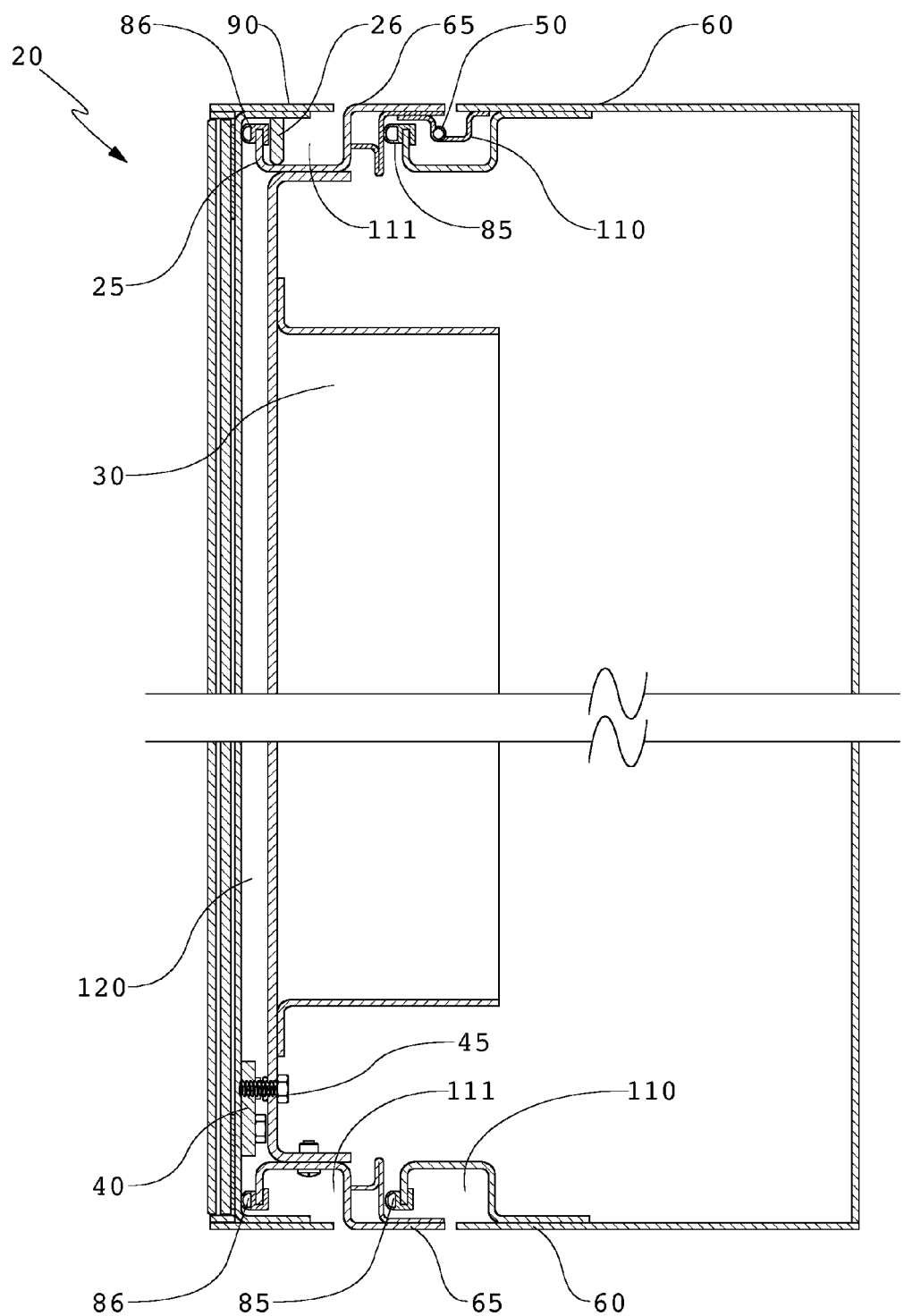
FIG. 4 provides a sectional view of an exemplary display when the front housing is closed.

FIG. 4 shows a sectional view of an exemplary display 20 when the front housing 65 is closed. This section is taken along a plane that is parallel to the line of sight of an observer. The rear housing 60 and front housing 65 are hingedly attached through the hinging mechanism 50. An optional first gutter 110 encircles the display 20 where the rear housing 60 and front housing 65 meet. The first gutter 110 has a portion defined by the front housing 65 and another portion defined by the rear housing 60. The housings overlap each other and at the overlap there may be a sealing material 85.

The front housing 65 may contain one or more hangers 25 which interact with one or more tabs 26 near the top of the front glass assembly 90. The front glass assembly 90 may also contain an attachment plate 40 where a fastening means 45 may be used with the attachment plate 40 to attach the front glass assembly 90 to the front housing 65. In an exemplary embodiment, the attachment plate 40 may contain a female threaded hole and the fastening means 45 may be a male threaded member which interacts with the threaded hole to draw the front housing 65 and front glass assembly 90 together. Also, in an exemplary embodiment the male threaded member would be held captive so that once it is retracted from the attachment plate 40 it would not fall and possibly become lost. Of course, the fastening means 45 can be any other mechanical means for attaching two elements together. Other embodiments may provide a threaded post on the attachment plate 40 where the threaded post passes through the front housing 65 and a nut may be tightened onto the post in order to draw the front housing 65 and front glass assembly 90 together. Other embodiments may use locking pins or snap connectors. The attachment plate 40 may be a separate piece that is attached to the frame or there may be an attachment plate integrated into the frame itself. In some embodiments, the hangers and tabs may not be used to attach the top of the front glass assembly 90 to the top of the front housing 65. In these embodiments, simple mechanical fasteners or the attachment plate and fastening means may be used.

An optional second gutter 111 encircles the display 20 where the front housing 65 and front glass assembly 90 meet. The second gutter 111 has a portion defined by the front housing 65 and another portion defined by the front glass assembly 90. The front housing 65 and front glass assembly 90 overlap each other and at the overlap there may be a sealing material 86. When the front glass assembly 90 is attached to the front housing 65 there may be a sealed channel 120 between the front glass assembly 90 and the image assembly 30. The channel 120 may be used as insulation between the cover glass and the image assembly 30 to prevent heat from transferring from the exterior glass to the image assembly 30. This can be useful in situations where the display 20 is placed in sunlight and may be subject to solar loading (heat buildup on the cover glass and/or image assembly due to radiative heat transfer from the rays of the sun). Still further, the channel 120 may provide a portion of a closed or open cooling loop which forces cooling gas through the channel 120 in order to cool the image assembly 30. One or more fans may be used to force air through the channel 120. Examples of exemplary closed cooling loops for electronic displays can be found at least in co-pending application Ser. No. 12/234,307 filed on Sep. 19, 2008; 12/237,365 filed on Sep. 24, 2008; and 61/138,736 filed on Dec. 18, 2008, each application herein incorporated by reference in their entirety. Of course, these closed loops can also be used to heat the image assembly 30 when the display 20 is placed in cold environments.

The components of the front glass assembly 90 may vary depending on the particular application. In most applications, the front glass assembly 90 will contain at least one pane of glass. In an exemplary assembly, there may be two panes of glass which are laminated together using index-matched optical adhesives. A frame may be used to surround the glass panes and provide attachment points such as the tabs 26 and the attachment plate 40. An exemplary frame may be formed from sheet metal, but could also be cast and/or machined or injection molded. Plastic or composite materials could also be used.

Figure 5A:
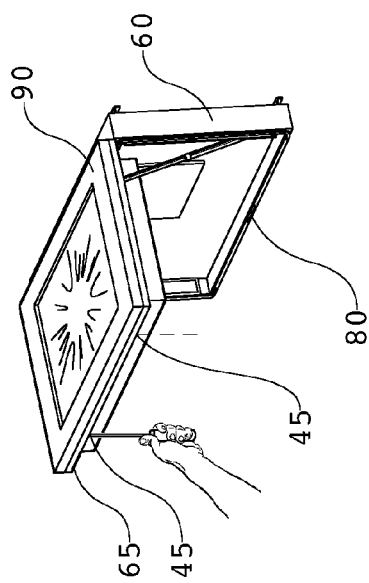
FIGS. 5A-5D provide an illustration of one method for the in-field replacement of the front glass assembly.

FIGS. 5A-5D provide an illustration of one method for the in-field replacement of the front glass assembly 90. In FIG. 5A, the latching mechanism 80 is released and the front housing 65 is opened to allow access to the interior of the display. The rear housing 60 remains in its mounted position. One or more fastening means 45 may be removed from the display to release the bottom of the front glass assembly 90 from the front housing 65. The top of the front glass assembly 90 however remains attached through one or more hangers 25.

Figure 5B:
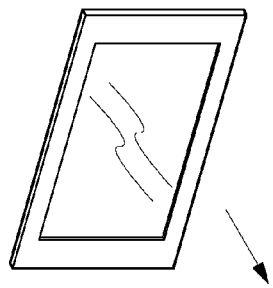
Figure 5C:
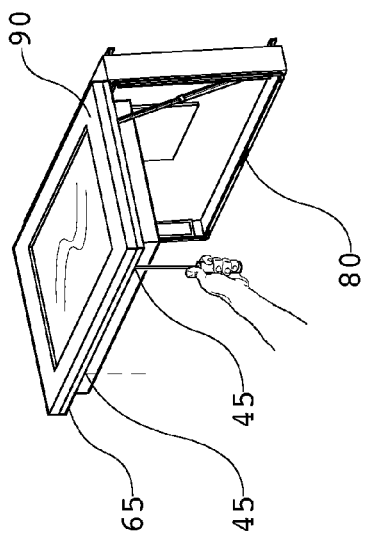
Figure 5D:
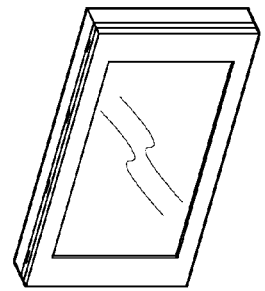

In FIG. 5B, the front housing 65 is closed and the damaged front front glass assembly is removed by lifting up off the hangers 25. A replacement front glass assembly is then placed on the hangers 25. In FIG. 5C, the front housing 65 is opened again to allow access to the interior of the display. One or more fastening means 45 may then be inserted to attach the bottom of the front glass assembly 90 from the front housing 65. In FIG. 5D, the front housing 65 is closed and the latching mechanism 80 attaches the bottom portions of the front and rear housings 65 and 60.

In the embodiments shown above, the front glass assembly 90 may be removed from the display assembly. Also discussed above, the front glass assembly 90 can have several components including the front glass panel(s), a surrounding frame, and various attachment means. In another embodiment, the front glass panel itself (one or more panes of glass or other transparent material) may be removed without removing/replacing the surrounding frame and/or attachment means.

With the exemplary embodiments herein, an electronic display can remain in its mounted position while the interior of the display can be accessed and various electronic components can be repaired or replaced. Further, by using the removable front glass assembly or removable glass panel designs, anyone with basic mechanical skills can easily replace a damaged front glass assembly with a new one. Thus, processes which previously had to be performed by specially-trained personnel can now be performed by minimally-trained personnel, even in the field. Further, the expensive, large, and sometimes very heavy electronic displays do not have to be removed from their mounted position in order to be serviced. This can save a lot of time and money when maintaining a fleet of electronic displays.

While certain embodiments of the present invention are described in detail above, the scope of the invention is not to be considered limited by such disclosure, and modifications are possible without departing from the spirit of the invention as evidenced by the following claims:

What is claimed is:

1. An in-field replaceable glass assembly for an electronic display placed within a housing having a hanger at the top of the housing, the glass assembly comprising:
   a frame surrounding a pane of glass and having a top and bottom;
   a tab at the top of the frame and adapted to hold the glass assembly in place when slipped over the hanger on the housing;
   a threaded post which extends from the frame and passes through an opening in the housing, and
   a nut adapted to be tightened onto the threaded post.

2. The glass assembly of claim 1 wherein:
   the means for attaching the bottom of the frame to the housing comprises a threaded hole for receiving a threaded fastener.

3. The glass assembly of claim 1 further comprising:
   a second pane of glass bonded to the first pane of glass with optical adhesive.

4. The glass assembly of claim 1 wherein:
   the tab and the hanger are oriented vertically.

5. The glass assembly of claim 1 further comprising:
   a gutter encircling the display where the housing and front glass assembly meet.

6. The glass assembly of claim 1 wherein:
   the tab contains a front surface facing an intended observer of the display and a rear surface facing away from the intended observer, where the front surface is adapted to rest against the hanger.

7. The glass assembly of claim 1 wherein:
   the frame is metallic.

8. The glass assembly of claim 1 further comprising:
   sealing material positioned between the tab and hanger.

9. A method for replacing a front glass assembly for an electronic display, the front glass assembly having a top with a tab and a bottom, the electronic display having a housing with a hanger, the method comprising the steps of:
   removing a fastener from the bottom of the front glass assembly by loosening a bolt that was threaded onto a female threaded hole within the front glass assembly;
   lifting the front glass assembly until the tab is released from the hanger on the electronic display housing;
   removing the front glass assembly;
   lowering a replacement front glass assembly until the tab is engaged with the hanger; and
   installing a fastener into the bottom of the replacement front glass assembly by tightening a bolt into a female threaded hole within the front glass assembly.

10. The method of claim 9 wherein:
    the tab is engaged with the hanger when the weight of the front glass assembly is fully supported by the hanger.

11. An in-field replaceable glass assembly for an electronic display placed within a housing having a hanger at the top of the housing, where the hanger has a front portion facing an intended observer of the display and a rear portion facing away from an intended observer, the glass assembly comprising:
    a frame surrounding a pane of glass and having a top and bottom;

a tab at the top of the frame and adapted to hang from the hanger on the housing where the tab rests against the rear portion of the hanger;
a threaded post extending from the frame and passing through a portion of the housing; and
a nut adapted to tighten against the threaded post.

12. The glass assembly of claim 11 further comprising:
a second pane of glass bonded to the first pane of glass.

13. The glass assembly of claim 11 wherein:
the tab and the hanger are oriented vertically.

14. The glass assembly of claim 11 further comprising:
a gutter encircling the display where the housing and front glass assembly meet.

15. The glass assembly of claim 11 wherein:
the frame is metallic.

16. The glass assembly of claim 11 further comprising:
sealing material positioned between the tab and hanger.

* * * * *